(12) United States Patent
Kaneda (10) Patent No.: US 7,985,624 B2
(45) Date of Patent: Jul. 26, 2011

(54) METHOD OF MANUFACTURING SEMICONDUCTOR DEVICE HAVING PLURAL DICING STEPS

(75) Inventor: Yoshiharu Kaneda, Ohtsu (JP)

(73) Assignee: Renesas Electronics Corporation, Kanagawa (JP)

( * ) Notice: Subject to any disclaimer, the term of this patent is extended or adjusted under 35 U.S.C. 154(b) by 182 days.

(21) Appl. No.: 12/203,189

(22) Filed: Sep. 3, 2008

(65) Prior Publication Data

US 2009/0057851 A1 Mar. 5, 2009

(30) Foreign Application Priority Data

Sep. 3, 2007 (JP) ................................. 2007-227569

(51) Int. Cl.
*H01L 21/56* (2006.01)
*H01L 23/28* (2006.01)

(52) U.S. Cl. .. 438/114; 438/112; 438/465; 257/E21.502

(58) Field of Classification Search .................. 438/458, 438/460, 112, 114, 465; 257/E21.502
See application file for complete search history.

(56) References Cited

U.S. PATENT DOCUMENTS

| 6,291,317 | B1 * | 9/2001 | Salatino et al. | 438/462 |
| 7,187,060 | B2 * | 3/2007 | Usui | 257/659 |
| 7,224,045 | B2 * | 5/2007 | Tabira et al. | 257/666 |
| 7,576,415 | B2 * | 8/2009 | Cha et al. | 257/659 |
| 2007/0062637 | A1 * | 3/2007 | Sjoedin | 156/250 |
| 2007/0235774 | A1 * | 10/2007 | Zandman et al. | 257/256 |

FOREIGN PATENT DOCUMENTS

JP    2005-51130    2/2005

* cited by examiner

*Primary Examiner* — Anh D Mai
(74) *Attorney, Agent, or Firm* — Young & Thompson (57) ABSTRACT

Provided is a method of manufacturing a semiconductor device including: arranging multiple dies planarly between a first lead frame plate and a second lead frame plate, which face each other, to connect the multiple semiconductor chips to each of the first lead frame plate and the second lead frame plate; filling a resin between the first lead frame plate and the second lead frame plate to seal the multiple dies; performing a first dicing on a laminated body including the first lead frame plate, the resin, and the second lead frame plate, between the adjacent dies, to separate at least the first lead frame plate by cutting; applying plating to the laminated body with at least the first lead frame plate being separated by cutting; and performing a second dicing on a remainder of the laminated body between the adjacent dies, to separate the laminated body into individual semiconductor devices.

11 Claims, 7 Drawing Sheets

NON-DEFECTIVE PRODUCT    DEFECTIVE PRODUCT

METHOD OF MANUFACTURING SEMICONDUCTOR DEVICE HAVING PLURAL DICING STEPS

BACKGROUND OF THE INVENTION

1. Field of the Invention

The present invention relates to a method of manufacturing a semiconductor device and, more particularly, to a method of manufacturing a semiconductor device having a semiconductor chip mounted therein.

2. Description of Related Art

As electronic devices are reduced in weight, thickness, and size, semiconductor devices tend to be produced in a miniaturized form. Packages of semiconductor devices have been increasingly reduced in size and weight, and the packages have become more compact.

Figure 10A:
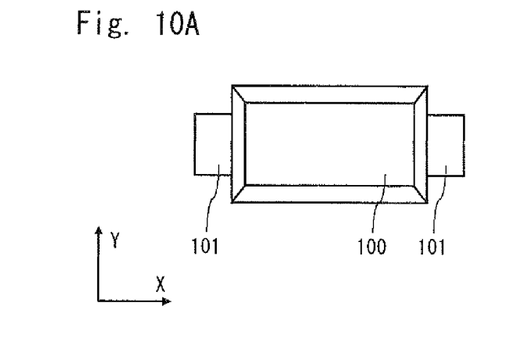
FIG. 10A is a plan view showing an example of a conventional semiconductor device and FIGS. 10B and 10C are side views thereof.
Figure 10B:
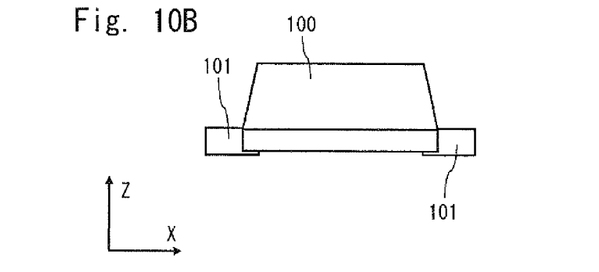
Figure 10C:
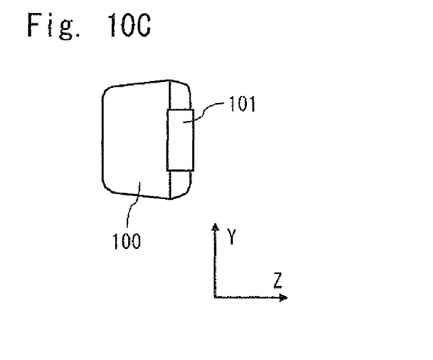

FIGS. 10A to 10C are diagrams each showing a related art example of a semiconductor device having a small package. FIG. 10A is a plan view showing the semiconductor device of the related art example. FIG. 10B is a side view of the semiconductor device of FIG. 10A viewed from an X-direction, and FIG. 10C is a side view thereof viewed from a Y-direction. In FIGS. 10A to 10C, the semiconductor device of the related art example includes a semiconductor chip (not shown) that is encapsulated in a package 100. The package 100 has a substantially quadrangular prism shape. On two short side surfaces of the package 100, which face each other, there are provided flat leads 101 serving as terminals. The flat leads 101 are each connected to the semiconductor chip in the package 100 and each protrude in the X-direction from each of the side surfaces of the package 100. The semiconductor device of the related art example shown in FIGS. 10A to 10C is called 2-pin XSOF (Extremely thin Small Outline Flat lead).

The 2-pin XSOF is manufactured by a manufacturing method similar to that for a typical semiconductor device, as described below. First, a plurality of semiconductor chips formed on a semiconductor wafer are separated by cutting into individual pieces, and then, each of the individual semiconductor chips is electrically connected to the flat leads 101. Next, each of the individual semiconductor chips connected to the flat leads 101 is set in a mold and is molded with a resin. In this manner, the semiconductor chip and the flat leads 101 are encapsulated in each package.

Figure 11:
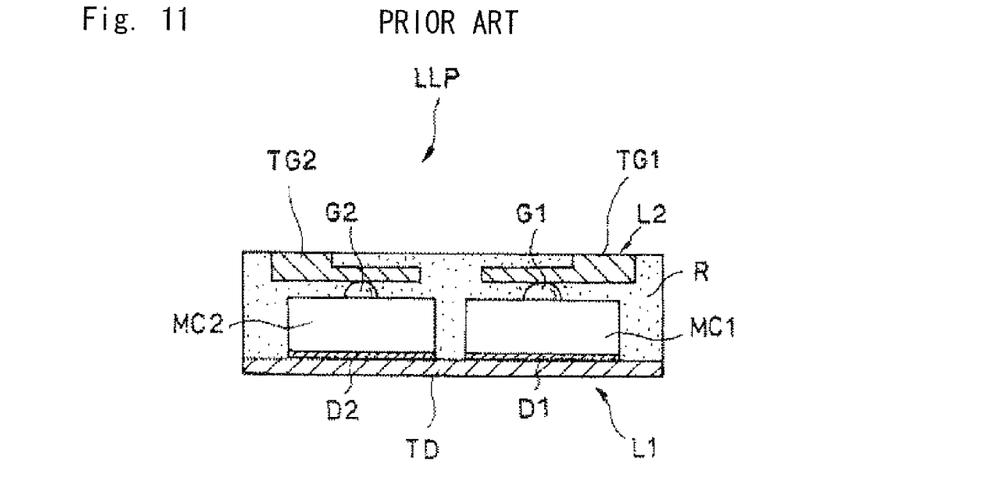
FIG. 11 is a cross-sectional diagram showing another example of a conventional semiconductor device.

As described above, conventional semiconductor devices are manufactured by carrying out an operation for individually connecting semiconductor chips to the flat leads 101. Meanwhile, Japanese Unexamined Patent Application Publication No. 2005-51130 discloses a method of manufacturing a semiconductor device by connecting semiconductor chips in a collective manner. FIG. 11 is a cross-sectional diagram showing an example of a semiconductor device having a small package as disclosed in Japanese Unexamined Patent Application Publication No. 2005-51130. In FIG. 11, a first MOS chip MC1 and a second MOS chip MC2 are planarly arranged on a lower electrode L1.

A drain electrode D1 of the MOS chip MC1 and a drain electrode D2 of the MOS chip MC2 are each directly connected to the lower electrode L1 to thereby form a common external drain electrode TD. Further, a gate electrode G1 of the MOS chip MC1 and a gate electrode G2 of the MOS chip MC2 are each directly connected to an upper electrode L2, whereby a first external gate electrode TG1 and a second external gate electrode TG2 are formed. Furthermore, source electrodes S1 and S2 (not shown) of the MOS chips MC1 and MC2 are each directly connected to the upper electrode L2, whereby first and second external source electrodes TS1 and TS2 (not shown) are formed. A resin R is filled between the upper electrode L1 and the lower electrode L2 to thereby form a leadless package LLP.

The semiconductor device as disclosed in Japanese Unexamined Patent Application Publication No. 2005-51130 is manufactured in the following manner. A plurality of MOS chips formed on a semiconductor wafer are separated by cutting into individual pieces, and then, the MOS chips MC1 and MC2 are mounted on a lead frame plate serving as the lower electrode L2. After that, with a gold bump formed on each of the MOS chips MC1 and MC2, a lead frame plate serving as the upper electrode L1 is connected to each of the MOS chips MC1 and MC2. The resin R is supplied between the upper electrode L1 and the lower electrode L2 and is molded, and the resultant is then separated by cutting into individual packages. In this manner, in the technique as disclosed in Japanese Unexamined Patent Application Publication No. 2005-51130, the upper electrode L2 is connected to the MOS chips in a collective manner, thereby reducing the number of manufacturing steps.

Incidentally, electrodes of semiconductor devices are generally subjected to outer plating in order to improve adhesion between each electrode and a solder. As disclosed in Japanese Unexamined Patent Application Publication No. 2005-51130, when a semiconductor device is formed such that a plurality of semiconductor chips are connected to lead frame plates in a collective manner and the plurality of semiconductor chips are separated by cutting into individual packages, the plating is generally performed prior to the separation by cutting. This is because, if the plating is performed prior to the separating by cutting, the plating can be applied to each lead frame plate. After the plating, the plurality of semiconductor chips are separated by cutting into individual packages, and a characteristic inspection is carried out to screen defective products (characteristic screening). However, the characteristic screening is performed on each of the individual packages separated by cutting. In other words, the characteristic inspection for screening defective products is performed on each package, which requires much time and labor.

SUMMARY

In one embodiment of the present invention, there is provided a method of manufacturing a semiconductor device including: arranging a plurality of semiconductor chips planarly between a first lead frame plate and a second lead frame plate placed opposite each other to connect the plurality of semiconductor chips to each of the first lead frame plate and the second lead frame plate; filling a resin between the first lead frame plate and the second lead frame plate to seal the plurality of semiconductor chips; performing a first dicing on a laminated body including the first lead frame plate, the resin, and the second lead frame plate, between the adjacent semiconductor chips, to separate at least the first lead frame plate by cutting; applying plating to the laminated body with at least the first lead frame plate being separated by cutting; and performing a second dicing on a remainder of the laminated body between the adjacent semiconductor chips, to separate the laminated body into individual semiconductor devices.

In the present invention, the plating is performed after separating at least the first lead frame plate by cutting in the first dicing. Accordingly, plating is not deposited on a region of the second lead frame plate, in which missing or a connection failure of a semiconductor chip occurs, whereby it is possible to observe a difference in external color.

According to the present invention, it is possible to provide a method of manufacturing a semiconductor device capable of easily screening defective products.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION OF THE PREFERRED EMBODIMENTS

The invention will now be described herein with reference to illustrative embodiments. Those skilled in the art will recognize that many alternative embodiments can be accomplished using the teachings of the present invention and that the invention is not limited to the embodiments illustrated for explanatory purposes.

Hereinafter, exemplary embodiments of the present invention are described. The embodiments of the present invention are described below, but the present invention is not limited to the following embodiments. The following description and drawings are omitted and simplified as appropriate for clarification of the explanation. Further, a redundant description thereof is omitted as appropriate for clarification of the explanation. Note that the same components are denoted by the same reference symbols throughout the description of the drawings while a description thereof is omitted as appropriate.

Figure 1:
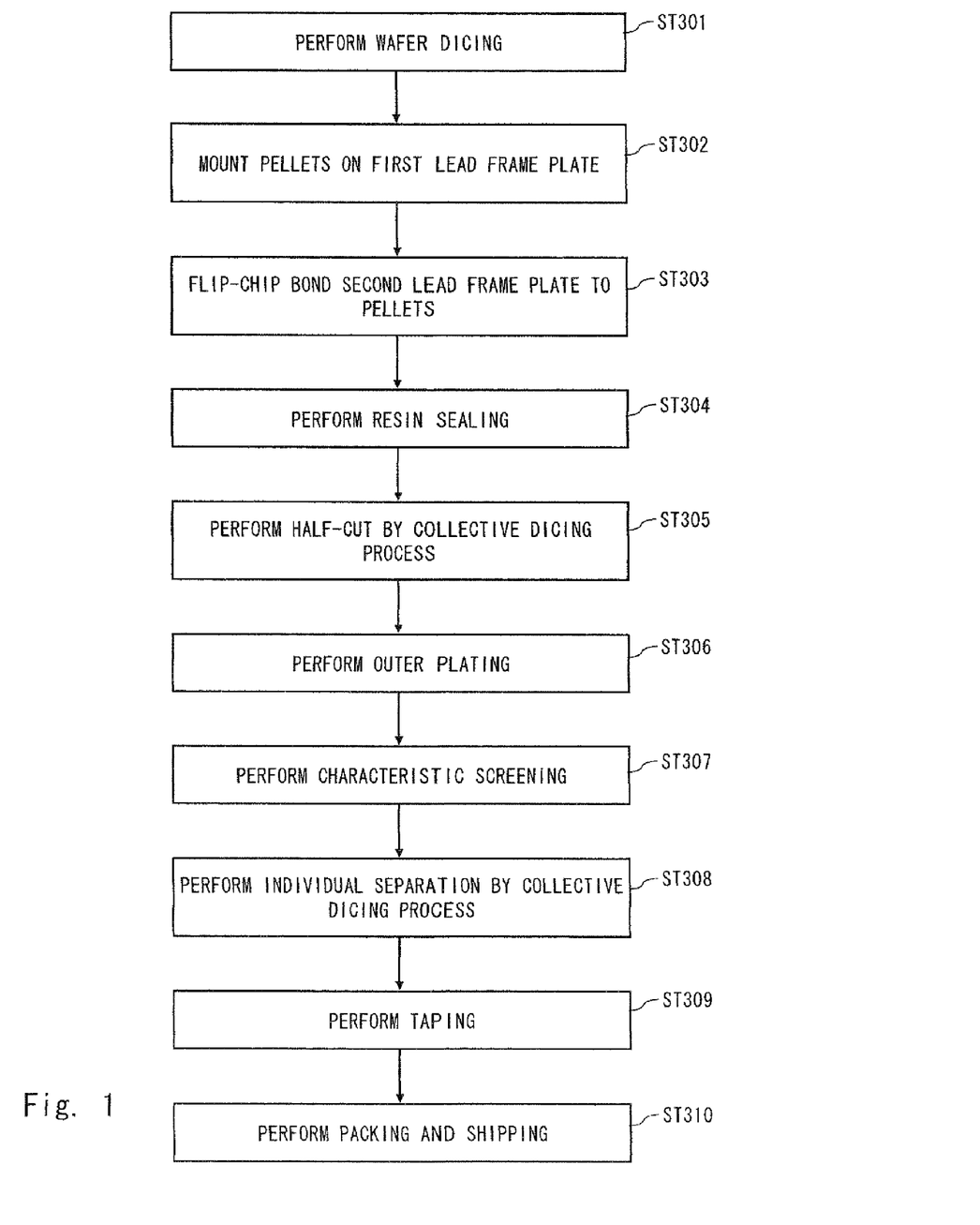
FIG. 1 is a flowchart showing a flow of a manufacturing process for a semiconductor device according to an embodiment of the present invention.

First, a method of manufacturing a semiconductor device according to an embodiment of the present invention is described in detail with reference to FIGS. 1, 2A to 2E, 3A and 3B. FIG. 1 is a flowchart showing a flow of a manufacturing process for a semiconductor device according to the embodiment of the present invention. In this case, the description is made with reference to FIGS. 2A to 2E, 3A, and 3B as appropriate. FIGS. 2A to 2E, 3A, and 3B are cross-sectional diagrams each showing the manufacturing process for the semiconductor device according to the embodiment of the present invention.

First, as shown in FIG. 1, a semiconductor wafer is diced (ST301) to thereby produce dies. A plurality of dies formed in the semiconductor wafer are separated by cutting into individual pieces by wafer dicing. Each die includes an electronic circuit built onto a silicon substrate or the like, and the die is also called a semiconductor chip or a pellet. In the embodiment of the present invention, there can be used a die having two input/output terminals, for example, a die formed of a diode or the like.

Figure 2A:
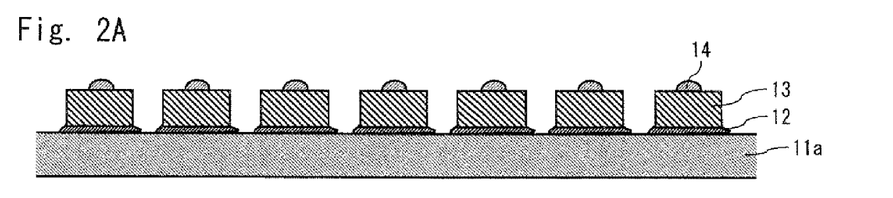
FIGS. 2A to 2E are cross-sectional diagrams each showing the manufacturing process for the semiconductor device according to the embodiment of the present invention.

Next, the dies, which are separated into individual pieces, are each mounted on a first lead frame plate (ST302). As shown in FIG. 2A, a first lead frame plate 11a is a flat metal plate such as a copper plate. On the first lead frame plate 11a, a plurality of dies 13 are spaced apart from each other to be arranged in a matrix form, and the dies 13 are each fixed onto the first lead frame plate 11a with a solder 12. In this case, each of the dies 13 is mounted such that a protruding electrode 14, which is formed in advance on the surface of each die 13, faces away from the first lead frame plate 11a. In other words, each of the dies 13 is mounted such that a surface opposite to the surface, on which the protruding electrode 14 is formed, faces the first lead frame plate 11a. In place of the solder 12, a conductive paste such as a silver paste can be used. As a result, as shown in FIG. 2A, the first lead frame plate 11a and the dies 13 are electrically connected to each other.

Figure 2B:
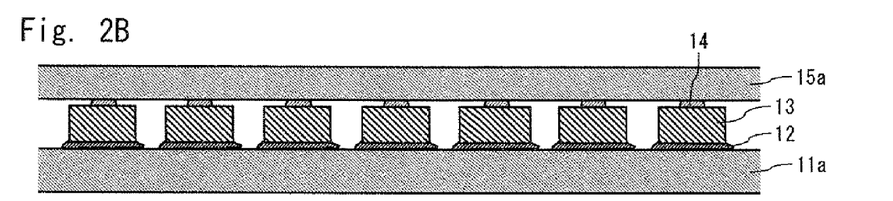

Next, a second lead frame plate 15a is flip-chip bonded to each of the dies 13 (ST303). To cover all the dies 13 mounted on the first lead frame plate 11a, the second lead frame plate 15a is aligned with the first lead frame plate 11a so as to oppose each other. Like the first lead frame plate 11a, the second lead frame plate 15a is a metal plate such as a copper plate formed of a single flat plate. Through pressurization with heating, each protruding electrode 14 and the second lead frame plate 15a are thermocompression bonded. As the protruding electrode 14, a solder ball, an Au bump, or the like is used. As a result, as shown in FIG. 2B, the dies 13 and the second lead frame plate 15a are connected to each other by a collective flip-chip technique.

Figure 4:
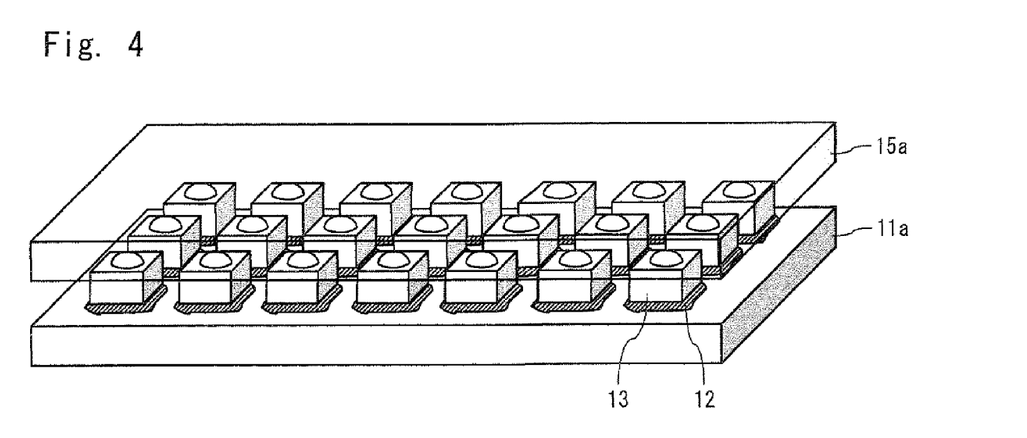
FIG. 4 is a perspective view showing a flip-chip bonded semiconductor device according to the embodiment of the present invention.

Referring now to FIG. 4, a description is given of a flip-chip bonded semiconductor device. FIG. 4 is a perspective view showing the flip-chip bonded semiconductor device according to the embodiment of the present invention, and FIG. 4 is a perspective view corresponding to the cross-sectional diagram of FIG. 2B. In FIG. 4, the plurality of dies 13 are sandwiched between the first lead frame plate 11a and the second lead frame plate 15a which is placed opposite each other. The plurality of dies 13 are electrically connected to each of the first lead frame plate 11a and the second lead frame plate 15a. In this case, the plurality of dies 13 are arranged in a matrix form.

Figure 2C:
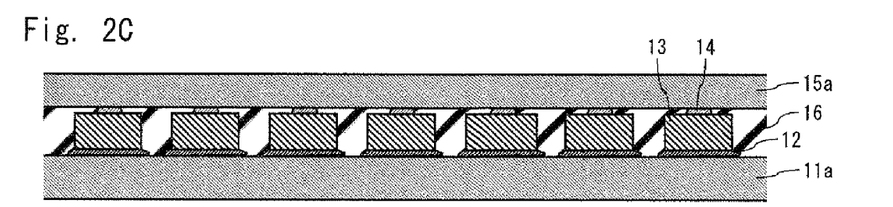

Next, resin sealing is carried out (ST304). Between the first lead frame plate 11a and the second lead frame plate 15a, a resin 16 such as an underfill resin is filled, and the resin 16 is cured. As a result, as shown in FIG. 2C, the dies 13 are sealed with the resin 16 between the first lead frame plate 11a and the second lead frame plate 15a. In a step of, for example, preparing the first lead frame plate 11a and the second lead frame plate 15a, it is preferable to form a plurality of irregularities (not shown) in advance at predetermined positions on a surface that is in contact with the resin 16. This leads to an improvement of adhesion between the first lead frame plate 11a or the second lead frame plate 15a and the resin 16 due to an anchor effect.

Figure 2D:
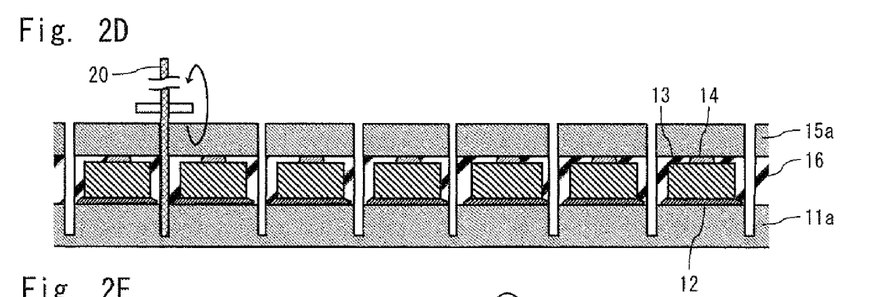

After the resin sealing, half-cut is carried out by a collective dicing process (ST305). The adjacent dies 13 are diced, for example, in a thickness direction from above the second lead frame plate 15a (first dicing). In this case, a laminated body including the first lead frame plate 11a, the resin 16, and the second lead frame plate 15a is subjected to half-cut, with a part of the first lead frame plate 11a in the thickness direction remaining uncut, and is diced in a lattice form. Specifically, in the first dicing, the second lead frame plate 15a and the resin 16 are completely cut to form upper electrodes 15, and the first lead frame plate 11a is cut partially through its thickness. As a result, as shown in FIG. 2D, the adjacent dies 13 are cut, with a part of the first lead frame plate 11a remaining uncut, and are partitioned into regions serving as semiconductor devices. Accordingly, in this step, a plurality of pieces of semiconductor devices are connected to each other in a matrix form through a part of the first lead frame plate 11a.

Figure 2E:
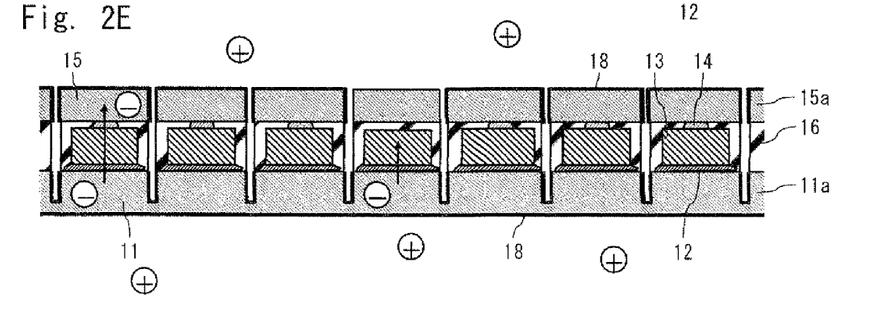

Then, outer plating is applied using tin (Sn), bismuth (Bi), or the like (ST306). In the embodiment of the present invention, the first lead frame plate 11a of the laminated body is used as a cathode and immersed in an anodic plating solution containing dissolved metal ions of a material for plating. As a result, as shown in FIG. 2E, a plating 18 is deposited on exposed surfaces of each of the first lead frame plate 11a and the upper electrode 15. Specifically, a surface (surface on lower side of FIG. 2E), which is opposite to a surface having the resin 16 formed thereon, and cut surfaces, which are obtained by the half-cut carried out in ST305, of the first lead frame plate 11a are subjected to the plating 18 by electrolytic plating. A surface (surface on upper side of FIG. 2E), which is opposite to a surface having the resin 16 formed thereon, and cut surfaces of the upper electrode 15 are subjected to the plating 18, in a region that is made electrically conductive with the first lead frame plate 11a.

In other words, as long as a lower electrode 11 formed of the first lead frame plate 11a is electrically connected to an upper electrode 15 formed of the second lead frame plate 15a in each area serving as a semiconductor device, the surface of the upper electrode 15 is covered with the plating 18 by electrolytic plating. Accordingly, in an area in which missing or a connection failure of the dies 13 occurs, among the areas serving as the semiconductor devices, the plating 18 is not deposited on the upper electrode 15. In the region in which the plating 18 is deposited, for example, the color of the lead frame plate is changed from a copper color to plating color (white, for example), and in the region in which the plating 18 is not deposited, the color of the lead frame plate remains unchanged. The external color of the upper electrode 15 is observed with eyes, thereby making it possible to determine whether the lower electrode 11 and the upper electrode 15 are electrically connected.

Figure 3A:
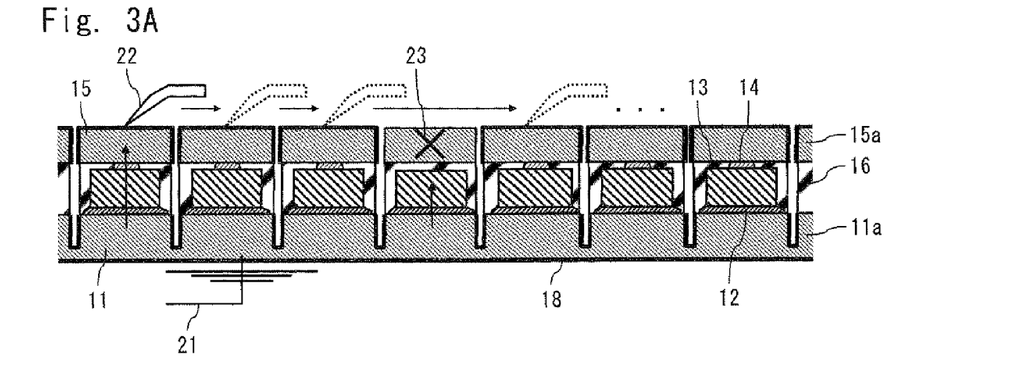
FIGS. 3A and 3S are cross-sectional diagrams each showing the manufacturing process for the semiconductor device according to the embodiment of the present invention.

After that, characteristic screening is carried out (ST307). A common electrode 21 is connected to the first lead frame plate 11a so as to supply a common potential. Then, as shown in FIG. 3A, a testing probe 22 is sequentially brought into contact with the upper electrode 15 in each area serving as a semiconductor device, to thereby carry out a more detailed inspection of electrical characteristics. It is determined whether the electrical characteristics satisfy predetermined conditions to thereby determine the semiconductor device as defective or non-defective. Then, an identification mark 23 is applied to a defective area. With the lower electrode 11 side of the connected semiconductor devices being used as a common ground, the testing probe 22 provided on the upper electrode 15 side is allowed to move, whereby the electrical characteristics of each semiconductor device can be determined. Also, it is possible to carry out the characteristic screening on the semiconductor devices, which are connected to each other and are not separated into pieces yet, that is, on each lead frame plate, whereby electrical characteristic screening can be easily performed.

Also in this case, in the embodiment of the present invention, the areas in which the external color of the upper electrode 15 remains unchanged are not subjected to the inspection of electrical characteristics, and it is only necessary to apply the identification mark 23 to the areas. Alternatively, after the plating is carried out in ST306, an appearance inspection is performed separately, and the identification mark 23 is applied in advance. Then, in ST307, the inspection of electrical characteristics may be performed only for the areas to which the identification mark 23 is not applied. Thus, a detailed inspection of electrical characteristics is carried out for the areas other than the areas in which the external color of the upper electrode 15 remains unchanged, whereby a time required for the inspection can be shortened and defective products can be easily screened.

Figure 3B:
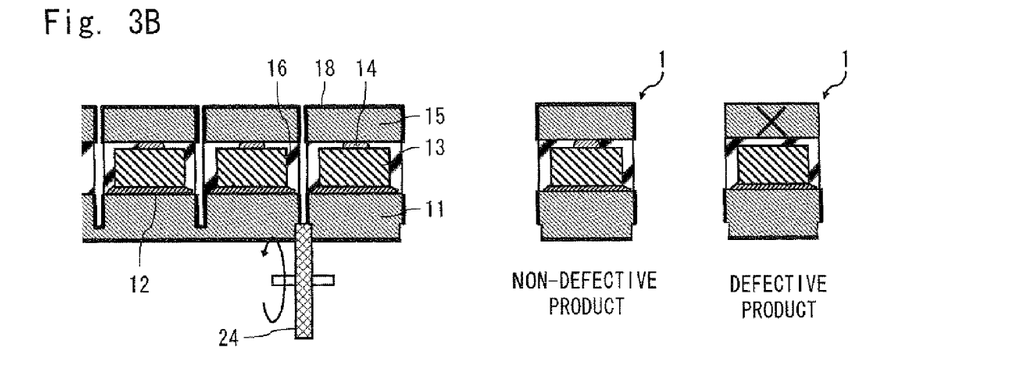

After the characteristic screening is finished, individual separation is carried out by a collective dicing process (ST308). The laminated body is diced in the thickness direction from the bottom side of the first lead frame plate 11a with a dicer 24 (second dicing). In this case, the laminated body is cut at positions corresponding to the areas subjected to half-cut in ST305, and is separated into individual pieces of semiconductor devices 1 as shown in FIG. 3B. The semiconductor devices 1 that are determined as defective products in ST307 or ST306 are discarded after the individual separation.

Note that, when the blade width of the dicer 24 is set slightly greater than that of a dicer 20 used in ST305, the separation can be reliably performed, and the dimensions of the lower portion of the lower electrode 11 become slightly smaller than those of the upper portion thereof. As a result, a step is formed between the upper portion and the lower portion of the lower electrode 11. The areas subjected to dicing in the step ST308, that is, cut surfaces obtained by cutting with the dicer 24, are not covered with the plating 18. For this reason, it is possible to distinguish between the upper electrode 15 and the lower electrode 11 based on the presence or absence of the step and the plating 18.

The semiconductor devices 1 manufactured through the above steps are taped, for example, bonded to a carrier tape (ST309), and are packed into a form suitable for shipping. After that, the taped semiconductor devices 1 are packed and shipped (ST310).

Figure 5:
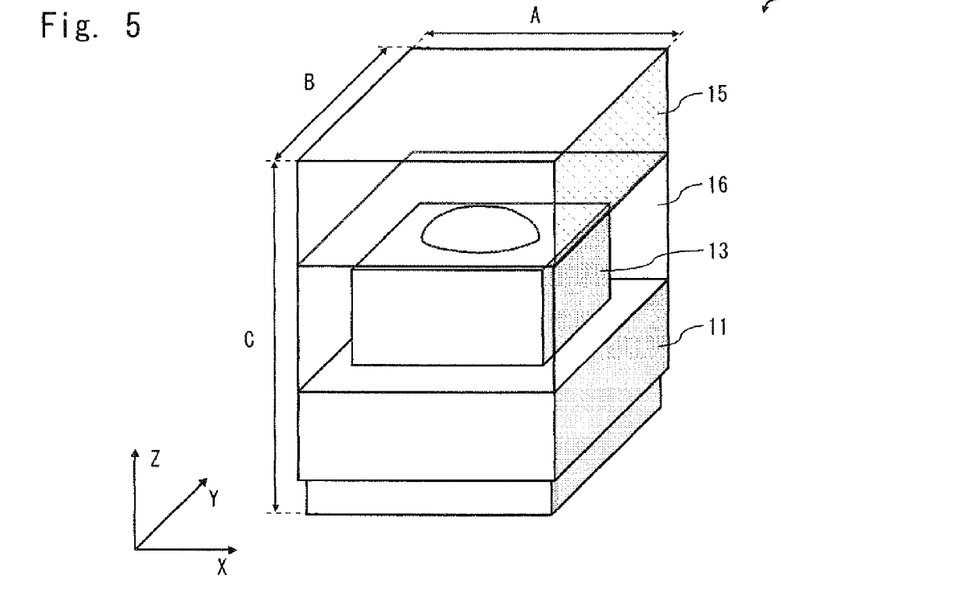
FIG. 5 is a perspective view showing the semiconductor device according to the embodiment of the present invention.
Figure 6:
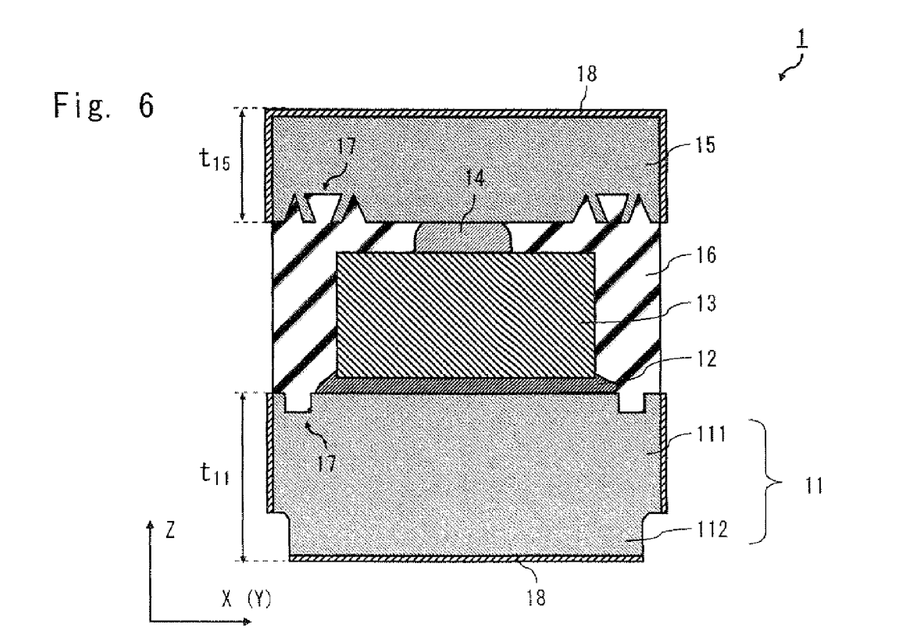
FIG. 6 is a cross-sectional diagram showing the semiconductor device according to the embodiment of the present invention.

Referring to FIGS. 5 and 6, a description is given of the semiconductor device thus formed according to the embodiment of the present invention. FIG. 5 is a perspective view of the semiconductor device according to the embodiment of the present invention. FIG. 6 is a cross-sectional diagram of the semiconductor device according to the embodiment of the present invention, and shows a cross-sectional structure thereof along the X-direction or Y-direction of FIG. 5. As shown in FIG. 5, the semiconductor device 1 according to the embodiment of the present invention has a structure in which the die 13 is sandwiched between the upper electrode 15 and the lower electrode 11 that is placed opposite each other, and in which the upper electrode 15, the die 13, and the lower electrode 11 are electrically connected to each other. Besides, the semiconductor device 1 includes the resin 16 filled between the upper electrode 15 and the lower electrode 11, and has an outer shape of a quadrangular prism.

Specifically, as shown in FIG. 6, the semiconductor device 1 according to the embodiment of the present invention includes the die 13 disposed above the lower electrode 11 through the solder 12. Each die 13 is a semiconductor chip having an electronic circuit built onto a silicon substrate or the like. The die 13 is directly connected to the lower electrode 11 through the solder 12 and is electrically connected to the lower electrode 11. As the solder 12, an adhesive such as a conductive paste may be used. Above the die 13, the upper electrode 15 is disposed through the protruding electrode 14. The die 13 is directly connected to the upper electrode 15 through the protruding electrode 14 and is electrically connected to each other. In short, the upper electrode 15 is connected to the die 13 by the flip-chip technique. A solder ball, an AU bump, or the like is formed as the protruding electrode 14.

Between the upper electrode 15 and the lower electrode 11, the resin 16 is filled. Accordingly, between the lower electrode 11 and the upper electrode 15, the die 13 is covered with the resin 16. The lower electrode 11 preferably has an uneven portion 17 in a region in contact with the resin 16. The adhesion with the resin 16 can be improved due to the anchor effect of the uneven portion 17. Similarly, the upper electrode 15 preferably has the uneven portion 17 in a region in contact with the resin 16.

As shown in FIGS. 5 and 6, the surface of the upper electrode 15 on the lower side of FIGS. 5 and 6 is covered with the resin 16, and the other surfaces thereof are exposed. Similarly, the surface of the lower electrode 11 on the upper side of FIGS. 5 and 6 is covered with the resin 16, and the other surfaces thereof are exposed. Accordingly, in the semiconductor device 1 according to the embodiment of the present invention, the lower electrode 11 is exposed at the bottom surface, and the upper electrode 15 is exposed at the top surface. Further, at each side surface of the semiconductor device 1, the upper electrode 15 and the lower electrode 11 are exposed. In other words, the semiconductor device 1 according to the embodiment of the present invention has a quadrangular prism shape, and has a structure in which the upper electrode 15 and the lower electrode 11 are exposed at each side surface. At each of four side surfaces of the semiconductor device 1, the upper electrode 15 and the lower electrode 11 are exposed. Thus, the semiconductor device 1 according to the embodiment of the present invention is formed by separating the first lead frame plate 11a and the second lead frame plate 15a by cutting in a plate thickness direction. As a result, the lower electrode 11 formed of the first lead frame plate 11a, and the upper electrode 15 formed of the second lead frame plate 15a are exposed at the cut surfaces.

The outer plating 18 is applied to the surfaces of each of the upper electrode 15 and the lower electrode 11, to thereby enable mounting. In other words, the surfaces other than the surface on which the resin 16 is formed are covered with the outer plating 18. The top surface and the side surfaces of the upper electrode 15 are covered with the outer plating 18. The bottom surface and a part (upper portion 111) of the side surfaces of the lower electrode 11 are covered with the outer plating 18. The side surfaces of a lower portion 112 of the lower electrode 11 are not covered with the outer plating 18. Further, in the lower electrode 11, the dimensions of the lower portion 112 in the X-direction and Y-direction are slightly smaller than those of the upper portion 111, and a step is formed therebetween. Thus, a band-like surface having a portion that is not subjected to the outer plating 18 and having a step is formed to the lower electrode 11, thereby making it possible to recognize the polarity of each electrode of the semiconductor device 1 by appearance.

Further, the dimensions of the upper electrode 15 and the lower electrode 11 in a Z-direction may be set different from each other. As shown in FIG. 6, assuming that the upper electrode 15 and the lower electrode 11 have different thicknesses, that is, assuming that the upper electrode 15 has a thickness of $t_{15}$ and the lower electrode 11 has a thickness of $t_{11}$, $t_{11} > t_{15}$ is defined in this case. Specifically, the semiconductor device 1 is manufactured using the first lead frame plate 11a having a thickness larger than that of the second lead frame plate 15a. In this manner, the thickness of the upper electrode 15 is made different from that of the lower electrode 11, thereby making it possible to recognize the polarity of each electrode of the semiconductor device 1 by appearance. It is possible to distinguish between the upper electrode and the lower electrode based on the presence or absence of outer plating, the presence or absence of a step, or a difference in thickness between the electrodes, or based on a combination thereof.

Figure 7:
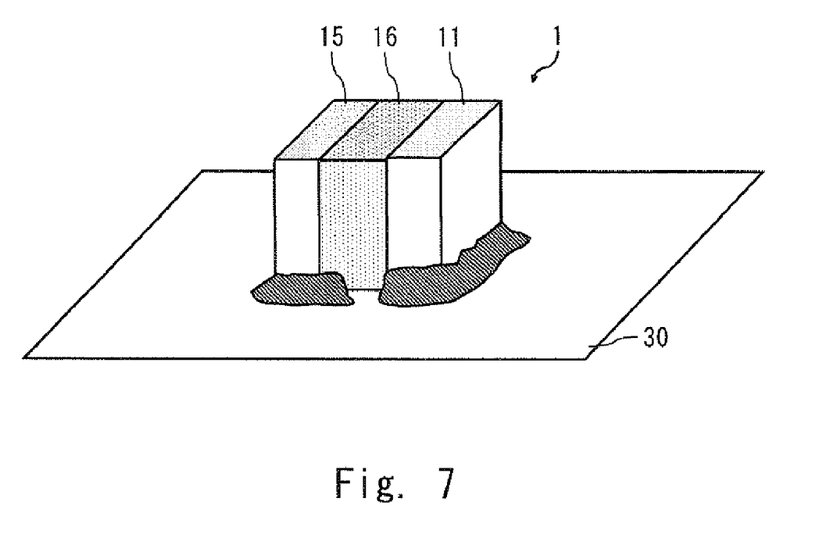
FIG. 7 is a view showing Mounting Example 1 of the semiconductor device according to the embodiment of the present invention.
Figure 9:
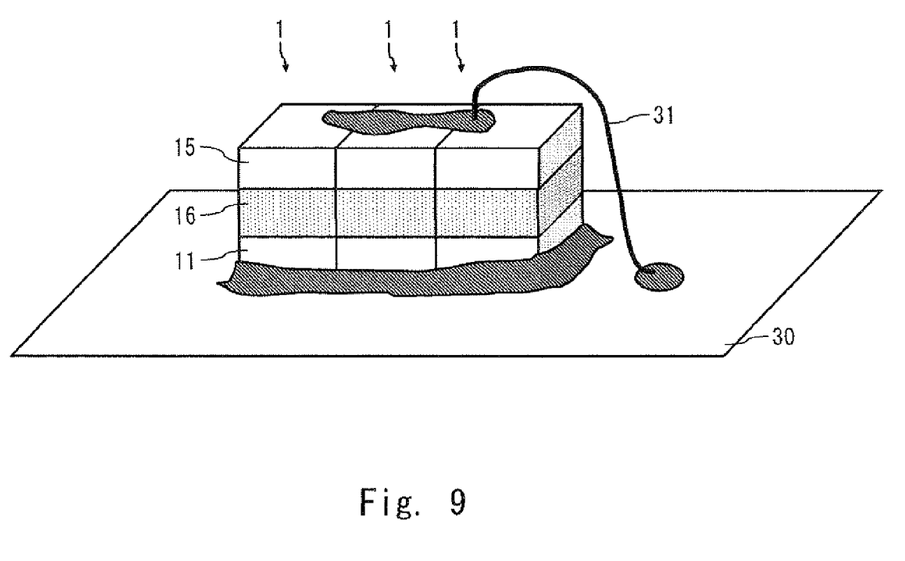
FIG. 9 is a view showing Mounting Example 3 of the semiconductor device according to the embodiment of the present invention.

The semiconductor device 1 is mounted on a substrate such as a printed wiring board. Referring next to FIGS. 7 and 9, a description is given of a method of mounting the semiconductor device 1 according to the embodiment of the present invention.

FIG. 7 is a view showing Mounting Example 1 of the semiconductor device according to the embodiment of the present invention. As shown in FIG. 7, the semiconductor device 1 according to the embodiment of the present invention can be mounted laterally with respect to the substrate 30 as shown in FIG. 7. A side surface of the quadrangular prism with a surface, at which the upper electrode 15 is entirely exposed, being set as a top surface, that is, a cut surface of the quadrangular prism can be connected to the substrate 30 so as to face each other. In the semiconductor device 1 according to the embodiment of the present invention, the upper electrode 15 and the lower electrode 11 are exposed at all the side surfaces, so all the side surfaces can be used as mounting surfaces. Accordingly, the semiconductor device 1 may be mounted with any one of the side surfaces facing the substrate 30.

Particularly in the mounting method, the semiconductor device 1 preferably has a square prism shape having outside dimensions in width (Dimension A in X-direction of FIG. 5) and depth (Dimension B in Y-direction of FIG. 5) which are substantially equal to each other. Further, when the height (Dimension C in Z-direction of FIG. 5) is set to be greater than the outer dimensions in width and depth, the semiconductor device 1 can be laterally mounted in a stable state. In other words, as shown in FIG. 5, the semiconductor device 1 favorably has a square prism shape satisfying Dimension A≈Dimension B<Dimension C, for example.

Thus, when the semiconductor device 1 has the square prism shape which has the surface, at which the upper electrode 15 is entirely exposed, being set as the top surface, and which has dimensions in width and depth that are substantially equal to each other, any one of the side surfaces may be used as a mounting surface. Accordingly, it is only necessary to determine the directions of the upper electrode 15 and the lower electrode 11 with respect to the substrate 30, with the result that the mounting can be facilitated.

Figure 8:
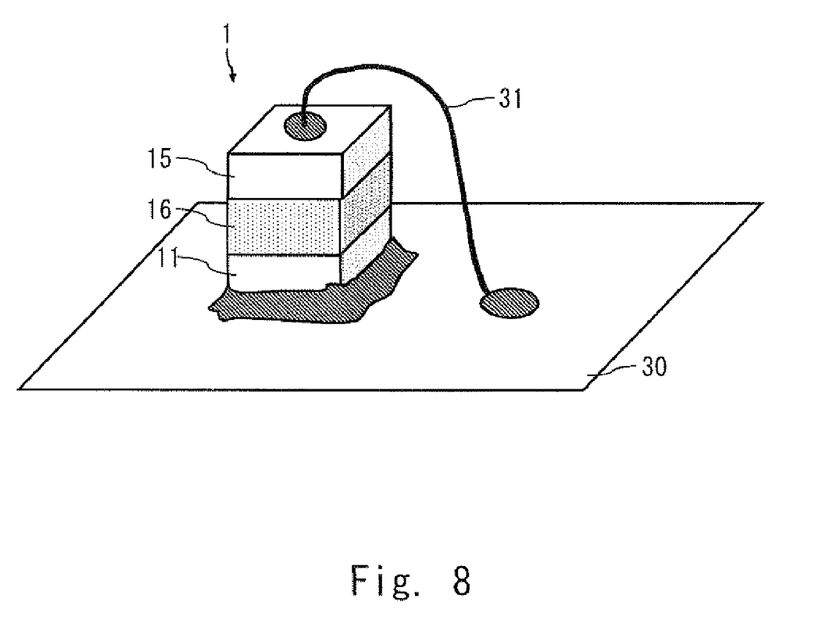
FIG. 8 is a view showing Mounting Example 2 of the semiconductor device according to the embodiment of the present invention.

FIG. 8 is a view showing Mounting Example 2 of the semiconductor device according to the embodiment of the present invention. As shown in FIG. 8, the semiconductor device 1 according to the embodiment of the present invention can be mounted longitudinally with respect to the substrate 30. Specifically, the surface at which the lower electrode 11 is entirely exposed is electrically connected to the substrate 30 so as to face each other, and the surface at which the upper electrode 15 is exposed is electrically connected to the substrate 30 via a bonding wire 31. Accordingly, the lateral mounting as shown in FIG. 7 or the longitudinal mounting as shown in FIG. 8 can be appropriately selected in a design stage, whereby the possibility of wire routing design can be increased. The upper electrode 15 side may be connected to the substrate 30 so as to face each other, and the lower electrode 11 may be connected to the substrate 30 via the bonding wire 31.

FIG. 9 is a view showing Mounting Example 3 of the semiconductor device according to the embodiment of the present invention. As shown in FIG. 9, the semiconductor devices 1 according to the embodiment of the present invention can be mounted such that a plurality of semiconductor devices 1 are mounted in parallel with each other and mounted longitudinally with respect to the substrate 30. Specifically, in a similar manner as in Mounting Example 2 of FIG. 8, the surface at which the lower electrode 11 is entirely exposed is connected to the substrate 30 so as to face each other. In this case, with the electrodes of the plurality of semiconductor devices 1 being directed in the same direction, the plurality of semiconductor devices 1 are connected to the substrate 30 with a conductive paste or the like, and the lower electrodes 11 of the plurality of semiconductor devices 1 are connected to each other. The plurality of semiconductor devices 1 may be arranged on the substrate 30 so that the adjacent side surfaces of the semiconductor devices 1 are brought into contact with each other.

Then, the surface at which the upper electrode 15 is entirely exposed is electrically connected to the substrate 30 via the bonding wire 31. In this case, when the conductive paste or the like is continuously formed so that the upper electrodes 15 of the plurality of semiconductor devices 1 are connected to each other, the upper electrodes 15 of the plurality of semiconductor devices 1 can be connected to the substrate 30 via a single bonding wire 31. As a result, the possibility of wire routing design on the substrate 30 can be increased. The upper electrode 15 side may be connected to the substrate 30 so as to face each other, and the lower electrodes 11 may be connected to the substrate 30 via the bonding wire 31.

In this manner, the semiconductor device 1 can be mounted by various methods as shown in FIGS. 7 to 9, whereby the freedom of mounting can be increased.

As described above, in the embodiment of the present invention, the sealing is performed using the resin 16 in the state where the plurality of dies 13 are sandwiched between the first lead frame plate 11a and the second lead frame plate 15a, which is placed opposite each other, and are electrically connected to each other. Then, the second lead frame plate 15a is completely cut by the half-cut, and is subjected to plating, with a plurality of semiconductor devices, which are to be separated into individual pieces, being connected to each other on the side of the first lead frame plate 11a. By such a method, as long as the lower electrode 11 formed of the first lead frame plate 11a is electrically connected to the upper electrode 15 formed of the second lead frame plate 15a, the plating 18 is deposited on the surface of the upper electrode 15. As a result, the external color of the upper electrode 15 is observed with eyes, thereby making it possible to determine whether the lower electrode 11 is electrically connected to the upper electrode 15. Accordingly, the time required for the inspection is shortened, and defective products can be easily screened.

Further, in the embodiment of the present invention, the connection between each die 13 and the upper electrode 15, and the resin sealing can be collectively performed in the state of the lead frame plate. After that, the semiconductor devices 1 are separated into individual pieces by the collective dicing process. As a result, the number of manufacturing steps can be reduced, and the semiconductor devices 1 can be easily formed.

Note that, in the embodiment of the present invention, there is illustrated the case where the half-cut is performed from the side of the second lead frame plate 15a in ST305 and the individual separation is performed from the side of the first lead frame plate 11a in ST308. However, the present invention is not limited thereto, and it may be the other way around. Specifically, the laminated body is diced in the thickness direction from the side of the first lead frame plate 11a, and the second lead frame plate 15a is cut partially through its thickness. Then, in ST308, the laminated body is diced in the thickness direction from the side of the second lead frame plate 15a, and is separated into the individual pieces of semiconductor devices 1. As a result, on the top surface side of the upper electrode 15, there are formed a band-like surface and a step that are not subjected to the plating 18.

Furthermore, in ST305, as long as at least one of the first lead frame plate 11a and the second lead frame plate 15a is completely cut, the other of the lead frame plates is not necessarily diced partially through its thickness. Specifically, in ST305, the half-cut for completely cutting one of the first lead frame plate 11a and the second lead frame plate 15a may be carried out, and in ST308, the other of the lead frame plates may be separated by cutting into the individual pieces of semiconductor devices 1.

Then, the outer plating may be carried out in ST306 in the state where one of the first lead frame plate 11a and the second lead frame plate 15a is completely cut and the multiple pieces of semiconductor devices 1 are connected to each other on the entirety of the other of the lead frame plates. In this case, the other of the lead frame plate is used as a cathode. Also in this case, as long as the lower electrode 11 formed of the first lead frame plate 11a is electrically connected to the upper electrode 15 formed of the second lead frame plate 15a in each of the areas serving as the semiconductor devices 1, the surface of the electrode formed on the cut side is covered with the plating 18. Accordingly, the external color of the electrode formed on the cut side is observed with eyes, thereby making it possible to determine whether the lower electrode 11 is electrically connected to the upper electrode 15. In this case, the other of the lead frame plates may be cut in ST308.

Further, in the embodiment of the present invention, the dicing is performed in ST308 in a direction opposite to that of ST305, but the dicing may be performed in the same direction as that of ST305. Furthermore, in ST305 and ST308, the semiconductor devices 1 are diced in a lattice form and formed into a quadrangular prism shape, but the shape of each semiconductor device 1 is not limited thereto. Various prism shapes can be appropriately employed.

The semiconductor device according to the present invention includes: a first electrode; a second electrode placed opposite to the first electrode; a semiconductor chip which is disposed between the first electrode and the second electrode and which is connected to each of the first electrode and the second electrode; and a resin filled between the first electrode and the second electrode to seal the semiconductor chip. In the semiconductor device, the first electrode and the second electrode are exposed at each of at least two surfaces extending along the laminated direction of the first electrode and the second electrode. For example, in the semiconductor device 1 shown in FIGS. 5 and 6, Z-direction is the laminated direction of the first electrode and the second electrode. At each of at least two surfaces extending this Z-direction, that is, at each of at least two side surfaces of the semiconductor device 1, the first electrode and the second electrode of the semiconductor device 1 are exposed. As a result, both of the two surfaces can be used as mounting surfaces, whereby the freedom of mounting can be increased. Although the case of forming four cut surfaces at which the first electrode and the second electrode are exposed by dicing is described by way of illustration in the above-described embodiment, the present invention is not limited thereto. Above effect can be obtained if the semiconductor device 1 has two cut surfaces or more at which the first electrode and the second electrode are exposed by dicing.

In this case, it is preferable that the dimensions of the first electrode in the direction along the laminated direction be different from the dimensions of the second electrode. For example, in the semiconductor device 1 shown in FIGS. 5 and 6, the thicknesses $t_{11}$, $t_{15}$ of the two electrodes are preferably set to be different from each other. Further, it is preferable that the first electrode and the second electrode be subjected to plating, and it is also preferable that one of the first electrode and the second electrode have a region that is not subjected to plating and formed on a surface extending along the laminated direction of the first electrode and the second electrode. As a result, it is possible to distinguish between the first electrode and the second electrode by appearance.

The embodiments of the present invention are described above, but the present invention is not limited to the above embodiments. It is possible for those skilled in the art to modify, add, or change the components of the above embodiments with ease within the scope of the present invention.

It is apparent that the present invention is not limited to the above embodiment but may be modified and changed without departing from the scope and spirit of the invention.

What is claimed is:

1. A method of manufacturing a semiconductor device, comprising:
   arranging a plurality of semiconductor chips planarly between a first lead frame plate and a second lead frame plate placed opposite each other to commonly connect each of the plurality of semiconductor chips to both of the first lead frame plate and the second lead frame plate;
   filling a resin between the first lead frame plate and the second lead frame plate to seal the plurality of semiconductor chips;
   performing a first dicing on a laminated body including the first lead frame plate, the resin, and the second lead frame plate, between the adjacent semiconductor chips, to separate at least the first lead frame plate by cutting;
   applying plating to the laminated body with at least the first lead frame plate being separated by cutting such that the plating is not provided on portions of the first lead frame plate corresponding to the semiconductor chips that exclude an electrical pathway between the first and second lead frame plates; and
   performing a second dicing on a remainder of the laminated body between the adjacent semiconductor chips, to separate the laminated body into individual semiconductor devices.

2. The method of manufacturing a semiconductor device according to claim 1, wherein the plating is applied, with the second lead frame plate being used as a cathode.

3. The method of manufacturing a semiconductor device according to claim 1, wherein the first dicing is performed such that the first lead frame plate and the resin are separated by cutting between the adjacent semiconductor chips, with only a part of the second lead frame plate being left.

4. The method of manufacturing a semiconductor device according to claim 3, wherein the second dicing is performed using a second dicer having a blade width greater than that of a first dicer used in the first dicing.

5. The method of manufacturing a semiconductor device according to claim 4, wherein the second dicing is performed in a direction opposite to that of the first dicing with respect to the laminated body.

6. The method of manufacturing a semiconductor device according to claim 1, wherein the second dicing is performed using a second dicer having a blade width greater than that of a first dicer used in the first dicing.

7. The method of manufacturing a semiconductor device according to claim 1, wherein the second dicing is performed in a direction opposite to that of the first dicing with respect to the laminated body.

8. The method of manufacturing a semiconductor device according to claim 1, wherein the second lead frame plate having a thickness different from that of the first lead frame plate is used.

9. The method of manufacturing a semiconductor device according to claim 1, wherein an uneven portion is performed at least one of the first lead frame plate and the second lead frame plate, the uneven portion is filled with the resin therein.

10. The method of manufacturing a semiconductor device according to claim 1, further comprising performing characteristic screening on semiconductor chips other than the semiconductor chips that exclude the plating prior to the second dicing.

11. A method of manufacturing a semiconductor device, comprising:
    arranging a plurality of semiconductor chips planarly between a first lead frame plate and a second lead frame plate placed opposite each other to commonly connect each of the plurality of semiconductor chips to both of the first lead frame plate and the second lead frame plate;
    filling a resin between the first lead frame plate and the second lead frame plate to seal the plurality of semiconductor chips;
    performing a first dicing on a laminated body including the first lead frame plate, the resin, and the second lead frame plate, between the adjacent semiconductor chips, to separate at least the first lead frame plate by cutting;
    applying plating to the laminated body with at least the first lead frame plate being separated by cutting;
    visually detecting between semiconductor chip(s) with plating provided on portions of the first lead frame plate and semiconductor chip(s) without plating provided on portions of the first lead frame plate right after the plating without electrically testing; and
    performing a second dicing on a remainder of the laminated body between the adjacent semiconductor chips, to separate the laminated body into individual semiconductor devices.

* * * * *